United States Patent [19]

Bowman

[11] Patent Number: 5,278,508
[45] Date of Patent: Jan. 11, 1994

[54] DIAGNOSTIC APPARATUS DISPLAYING ENGINE OPERATING CHARACTERISTICS IN THE PARAMETERS IN WHICH THE CHARACTERISTICS ARE MEASURED

[76] Inventor: Robert M. Bowman, 14450 Bowers Dr., Ramsey, Minn. 55303

[21] Appl. No.: 890,678

[22] Filed: May 29, 1992

[51] Int. Cl.⁵ .................... G01R 31/02; G01R 1/073; F02P 17/00; G01M 15/00
[52] U.S. Cl. .................... 324/384; 23/117.2; 324/72.5; 324/73.1; 324/103 R; 324/402; 324/503; 324/537; 364/424.04
[58] Field of Search ............... 324/378, 379, 380, 384, 324/402, 72.5, 73.1, 103; 73/116, 117.2, 117.3; 364/424.03, 424.04, 431.03, 431.04

[56] References Cited

U.S. PATENT DOCUMENTS

| | | | |
|---|---|---|---|
| 2,237,187 | 4/1941 | Mantilla | 324/72.5 X |
| 3,626,358 | 12/1971 | Klassen | 324/72.5 X |
| 4,291,383 | 9/1981 | Tedeschi et al. | 73/117.2 |
| 4,825,167 | 4/1989 | Bayba | 324/402 X |
| 5,003,477 | 3/1991 | Abe et al. | 73/117.2 X |
| 5,160,892 | 11/1992 | Makhija et al. | 324/384 X |

OTHER PUBLICATIONS

Micro Processor Systems, Inc. price list; pp. 12 and 13 of a catalog on the IBOB 9000; a 2 page flyer entitled "Intelligent Break Out Box"; a page entitled The Ultimate Diagnostic Tool Intelligent Break Out Box, Jun. 1990.

An informational brochure from J. S. Popper, Inc. entitled "Test clip reaches the . . . ", May 26, 1987.

*Primary Examiner*—Gerard R. Strecker
*Attorney, Agent, or Firm*—Palmatier, Sjoquist & Helget

[57] ABSTRACT

An auto diagnostic apparatus having jawed, needle-toothed clips for connection to variable output wires of engine sensors adjacent to the sensors, and a processor which converts the output voltages to output values in reader friendly units understandable to the auto technician, and which stores and continuously updates the minimum and maximum output values for diagnosing intermittent or periodically interrupted electrical current. The needle-toothed clips establish an electrical connection to the variable output sensor wire without damaging the insulation or integrity of the sensor wire.

7 Claims, 7 Drawing Sheets

DIAGNOSTIC APPARATUS DISPLAYING ENGINE OPERATING CHARACTERISTICS IN THE PARAMETERS IN WHICH THE CHARACTERISTICS ARE MEASURED

BACKGROUND OF THE INVENTION

The present invention relates to an auto diagnostic apparatus.

The majority of autos on the road today are computerized. In other words, the cars have control or processing units which receive and process information from sensors strategically placed on the internal combustion engine. These sensors include a throttle positioning sensor, a manifold absolute pressure sensor (a barometric and engine vacuum sensor), an oxygen sensor, an engine coolant sensor, an air charge temperature sensor to measure incoming air, an EGR valve positioning sensor, a vane air temperature sensor, and other sensors.

An auto technician conventionally chooses from one of two types of "scanners" to access information provided by such sensors. Each of the two types of scanners connects directly to the automobile's computer. Each of the two types of scanners is limited to only that information the vehicle's computer is programmed to share with the scanner.

One type of scanner provides "trouble codes," i.e., a numerical code followed by a description of the "diagnosis." The trouble code is generated by the central processing unit of the auto and is based on information provided by engine sensors. An example of a trouble code list is shown in Table 1. Trouble code information, such as that listed in Table 1, is typically available for most domestic and foreign cars.

TABLE 1

| TROUBLE CODE LIST |
| --- |
| 33 EGR VALVE NOT OPENING |
| 71 IDLE TRACKING SW STUCK OR CKT PROBLEM |
| 95 FUEL PUMP CKT OPEN - ECA TO GROUND |

A trouble code is typically generated only for major malfunctions that will blow the sensors wide open or cause the sensors to short out. Any intermediate outputs of the sensor are typically ignored by a trouble code scanner even though the values generated by the sensor may be in error. For example, a manifold absolute pressure sensor (barometric sensor) for an engine operating in the mile-high city of Denver may in fact provide an output voltage reflecting operation of the engine at sea level. A trouble code scanner typically does not note this "incorrect" value since operation at sea level is one of the many normal operating altitudes.

The second general type of scanner provides a "data stream," which conveys more useful information than a trouble code list. Like trouble code scanners, data stream scanners connect directly to the automobile's computer via a diagnostic plug. A data stream lists the sensors along with an output value for each of the sensors such as rpm, milliseconds, pressure, degrees, or voltage. An example of a data stream list is shown in Table 2. Such information is generally available for GM and Chrysler vehicles only, as these vehicles have diagnostic plugs.

TABLE 2

| DATA STREAM LIST | |
| --- | --- |
| VEHICLE INFORMATION | |
| DIAGNOSTIC STATE | 8 ALCL |
| TROUBLE CODES SEE MANUAL | |
| ENGINE INFORMATION BLOCK | |
| ENGINE RPM | 2125 |
| DESIRED IDLE X10 | 10 |
| 02 STATE | LEAN |
| LOOP STATUS | OPEN |
| COOLANT TEMP. | 023 DEG C. |
| THROT. POS. SENSOR | 1.70 V |
| 02 SENSOR VOLTAGE | 0.370 V |
| INJECT. PULSE WID. | 99.9 as |
| BATTERY VOLTAGE | 08.5 V |
| MAP SENSOR | 041 KPA |
| MAP SENSOR | 1.70 V |
| IDLE AIR CONTROL | 005 |
| SPARK ADVANCE | 37 DEB |
| BLOCK LEARN | 005 |
| INTEGRATOR | 005 |
| EGR D.C. | NO |
| EGR DIAG.-POSITION | YES |
| MANIFOLD AIR | 023 C |
| CLEAR FLOOD MODE | ON |
| TRANSMISSION INFO. BLOCK | |
| VEHICLE SPEED | 136 KPH |
| T.C. CLUTCH | OFF |
| PARK/NEUTRAL | OFF |
| CRUISE CONTROL | OFF |
| SET-COAST | NO |
| RESUME-ACCEL | YES |
| BRAKE SWITCH | OFF |
| MISC. VEHICLE DATA INFO. | |
| CRANK | OFF |
| POWER STEERING | NORM |
| A/C REQUEST | NO |
| AIR/COND. CLUTCH | OFF |
| FAN | ON |
| 02 CROSS COUNTS | 234 |

Trouble code scanners are available for GM, Chrysler, and Ford vehicles. Data stream scanners are available for GM and Chrysler vehicles, and only recently have become available for newer Ford vehicles (some 1990 and newer models). To obtain a data stream on an older Ford vehicle, an auto technician uses a "break out box," i.e., a box that is connected in series between the male and female 60 pin connector of the Ford computer or central processing unit. The break out box is located at a remote, inconvenient, almost inaccessible location under the dash on most cars. The break out box typically includes 60 female connections, and an auto technician measures the voltage output between a predefined pair of female connections for each of the sensors. After obtaining a voltage reading, the auto technician translates the computer voltage reading into rpm, milliseconds, pressure, degrees, or voltage. Only one sensor at a time may be monitored. This process is time consuming and hence expensive to the car owner. It should be noted that Ford Motor Company markets, to its dealerships, an "Oasis" system which provides a data stream for newer Ford vehicles and which may not require a break out box, as some of the newer Ford vehicles now have diagnostic plugs. However, since pre-1990 Ford vehicles lacked such diagnostic plugs, such vehicles cannot be diagnosed with the "Oasis system."

Prior art diagnostic apparatus for providing trouble codes include the MT 2500 from Snap On Tool Corp., the Monitor 2000 & 4000 from the Owatonna Tool Corp., the Brainmaster from the Alltest Division of Triplitt Corp., and the ProLink 9000 from Micro Processor Systems, Inc. Break out boxes are available from the Ford Motor Co., Owatonna Tool Corp., and Thexton Manufacturing of Minneapolis. Micro Processor Systems, Inc. also markets an I.B.O.B. (Intelligent Break Out Box). It should also be noted that a clip for being electrically connected to an insulated wire through the insulation without destroying the insulation is marketed by J. S. Popper, Inc. of Little Ferry, N.J. This clip is identified by the designation "JP 8783 CLIP."

SUMMARY OF THE INVENTION

An object of the present invention is to provide an auto diagnosis apparatus for diagnosing cars without means for ready access to the car's computer (i.e., cars without diagnostic plugs).

Another object of the present invention is to provide an auto diagnosis apparatus which bypasses the car's computer and connects directly to the car's sensors.

Another object of the present invention is to provide an auto diagnosis apparatus which tracks the minimum and maximum voltages produced by the car's sensors.

A feature of the present invention is the provision in an auto diagnostic apparatus having a processor for receiving and processing output voltages from engine sensors, of electrical connection means for direct connection to output wires of the sensors at locations immediately adjacent to the sensors without disconnecting the output wires from the sensors.

Another feature is the provision in such an auto diagnostic apparatus, of a storage component to record the maximum and minimum output values corresponding to the output voltages of each of the sensors whereby intermittent or periodically interrupted current from the sensors is recorded.

Another feature is the provision in such an auto diagnostic apparatus, of the electrical connection means including a clip having a pair of swingable jaws biased toward one another, wherein at least one of the jaws has a set of relatively short needle teeth for penetrating the insulation to make electrical contact with the conductive strand while maintaining the integrity of the insulation.

Another feature is the provision in such an auto diagnostic apparatus, of the information on the output voltages for converting the output voltages to output values being mounted on a cartridge which is removable from the apparatus and replaceable with another cartridge having different information for, by way of example, European and Asian cars.

Another feature is the provision in an automobile processor for an internal combustion engine having engine sensors for sending output voltages to the computer, of conversion means for converting the output voltages to output values, of storage means for continuously receiving and storing minimum and maximum output values over a predefined time, and of means for communicating the minimum and maximum values whereby an intermittent output value is stored for diagnosing an intermittent malfunction.

An advantage of the present invention is that it monitors the output voltages of each of the sensors directly off of the respective sensor. Accordingly, the present auto diagnostic apparatus bypasses the auto's internal wiring and any problems associated therewith.

Another advantage is that hookup of the auto diagnostic apparatus is easily and quickly accomplished.

Another advantage is that the present invention eliminates the need for a break out box, the use of which is required for the great majority of Ford vehicles.

Another advantage is that the present auto diagnostic apparatus eliminates the need to consult long and complicated service manuals and diagnostic flow charts.

Another advantage is that intermittent voltages are discovered and retained in storage for subsequent diagnosis.

Another advantage is that the present auto diagnostic apparatus may be used in conjunction with a break out box.

Another advantage is that the present invention monitors a plurality of sensors at one time.

DETAILED DESCRIPTION OF THE PREFERRED EMBODIMENTS

Figure 1:
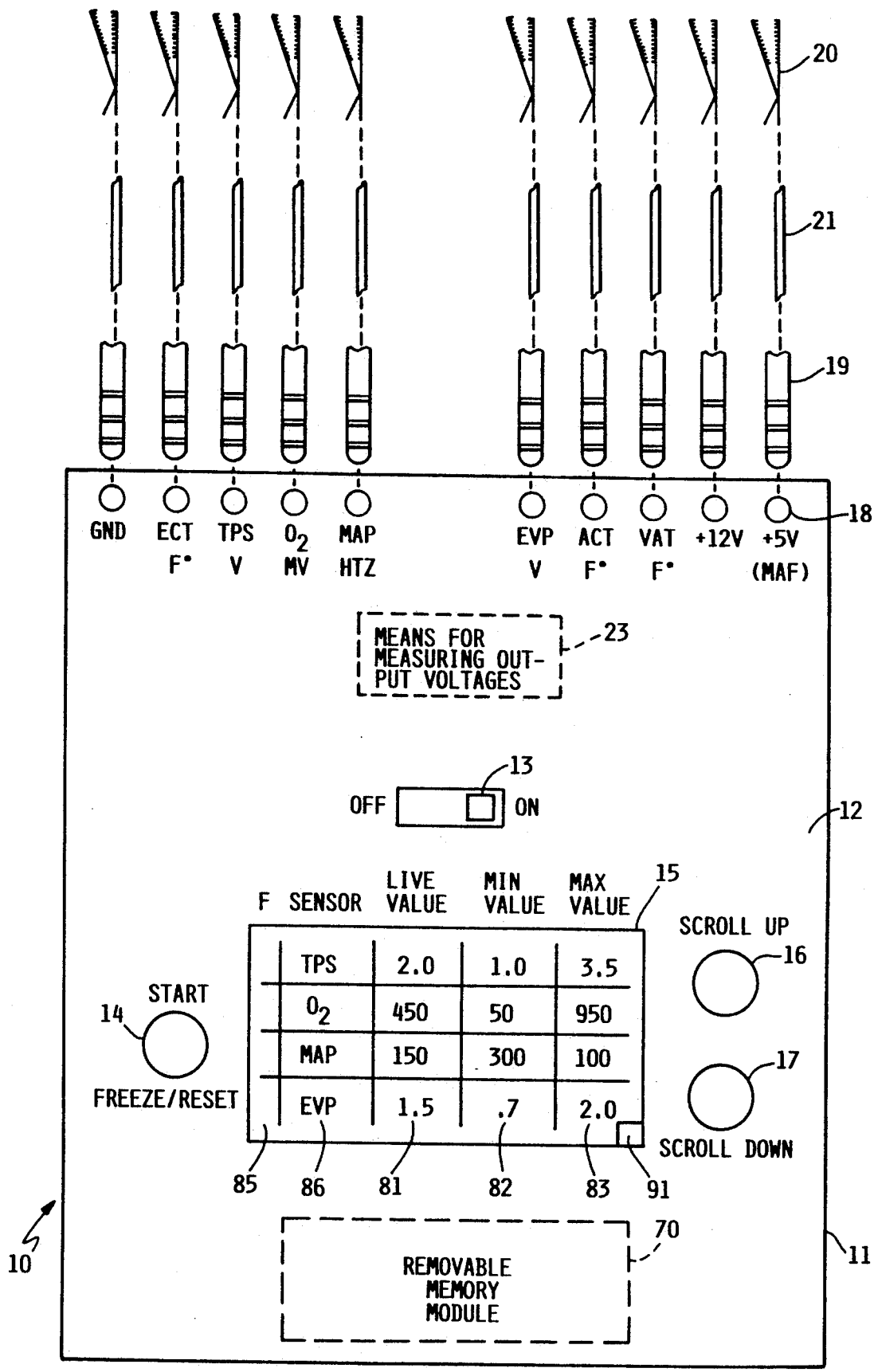
FIG. 1 is a diagrammatic view of the present auto diagnostic apparatus.

As shown in FIG. 1, the present auto diagnostic apparatus is indicated in general by the reference numeral 10. It includes a processor 11 which mounts a control panel 12 with an on/off switch 13 for controlling power to the apparatus 10, a start/freeze/reset push button switch 14 for controlling the display of output values of engine sensors in an LCD display panel 15, and respective scroll up and scroll down push button switches 16, 17 for controlling which sensors are currently being displayed in the display panel 15. The processor 11 further includes a set of banana jacks or sockets or female connectors 18 for receiving banana clips or male pin connectors 19 which are electrically connectable to engine sensors or connections 100-109 (FIG. 5A) via jawed, needle-tooth clips 20 and electrical wires or leads 21 extending between the needle-tooth clips 20 and banana clips 19. The processor 11 further includes an A/D converter or means 23 for measuring the output voltages of the sensors or connections 100-109. The processor 11 further includes a removable memory module or cartridge 70 which contains an integrated circuit with information for converting output voltages derived from the sensors or connections 100-109 to understandable output values for display in the display panel 15. The processor 11 further includes a storage cell or means 72 for updating minimum and maximum values corresponding to output voltages, and storage cell or means 71 for storing the minimum and maximum values which correspond to the output voltages (see FIG. 5A).

Figure 2:
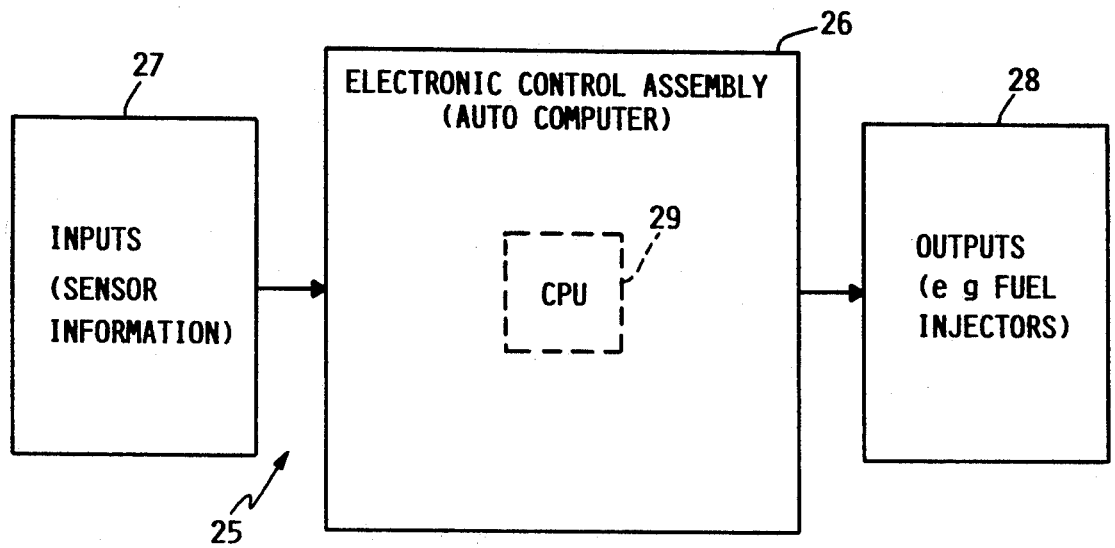
FIG. 2 is a diagrammatic view of an electronic engine control system.
Figure 5A:
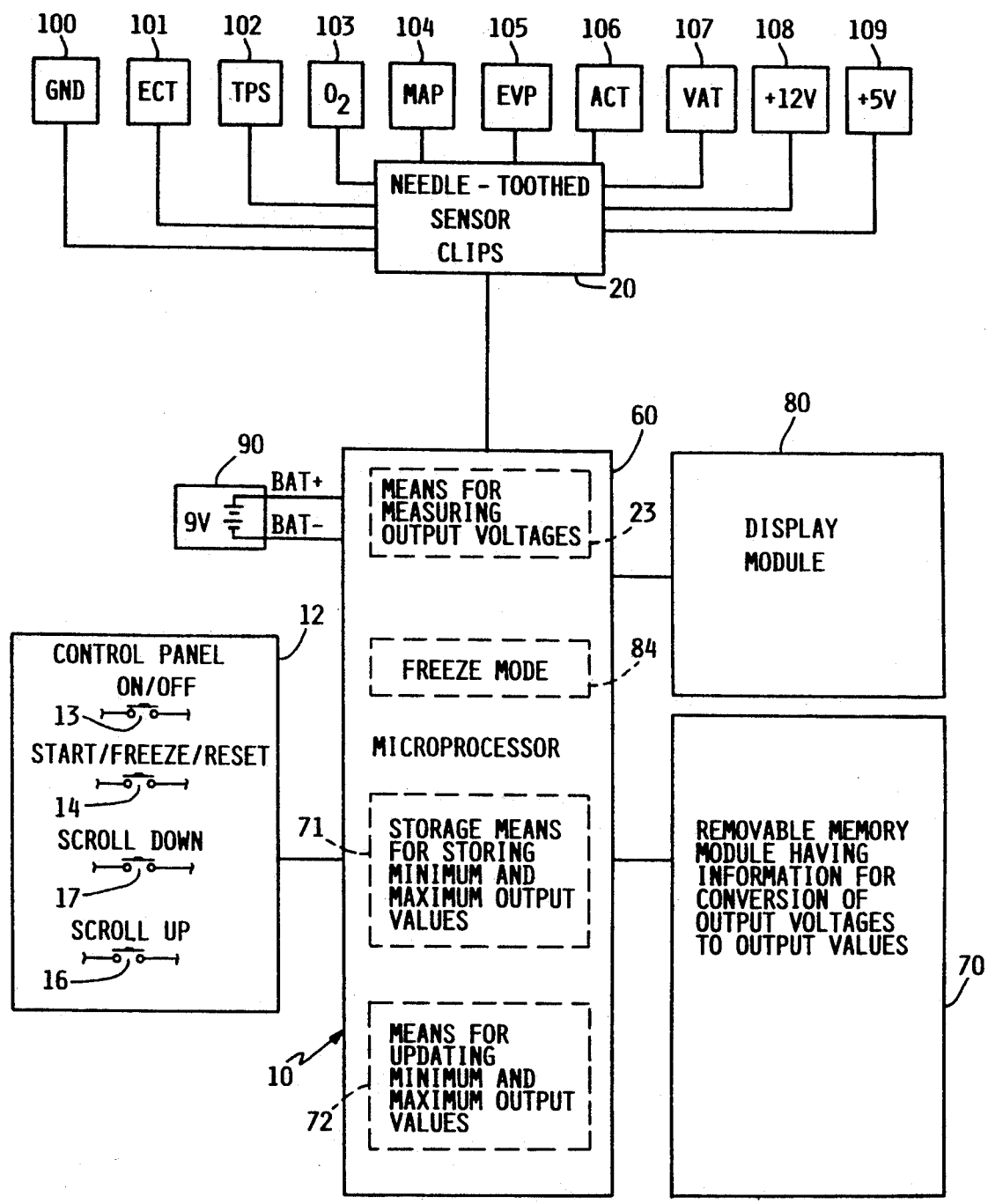
FIG. 5A is a functional block diagram of the auto diagnostic apparatus of FIG. 1.

As shown in FIG. 2, an electronic engine control system 25 includes an electronic control assembly or auto computer 26 and input means 27 such as the engine sensors 101-107 (FIG. 5A). This sensor information is conveyed to the electronic control assembly or microcomputer 26, which processes such input signals and in response thereto generates output signals to output devices 28 such as fuel injectors, fuel pump relays, EGR shut-off solenoids, throttle air bypass valve solenoids, and ignition modules. The electronic control assembly 26 includes a central processing unit 29.

Figure 3:
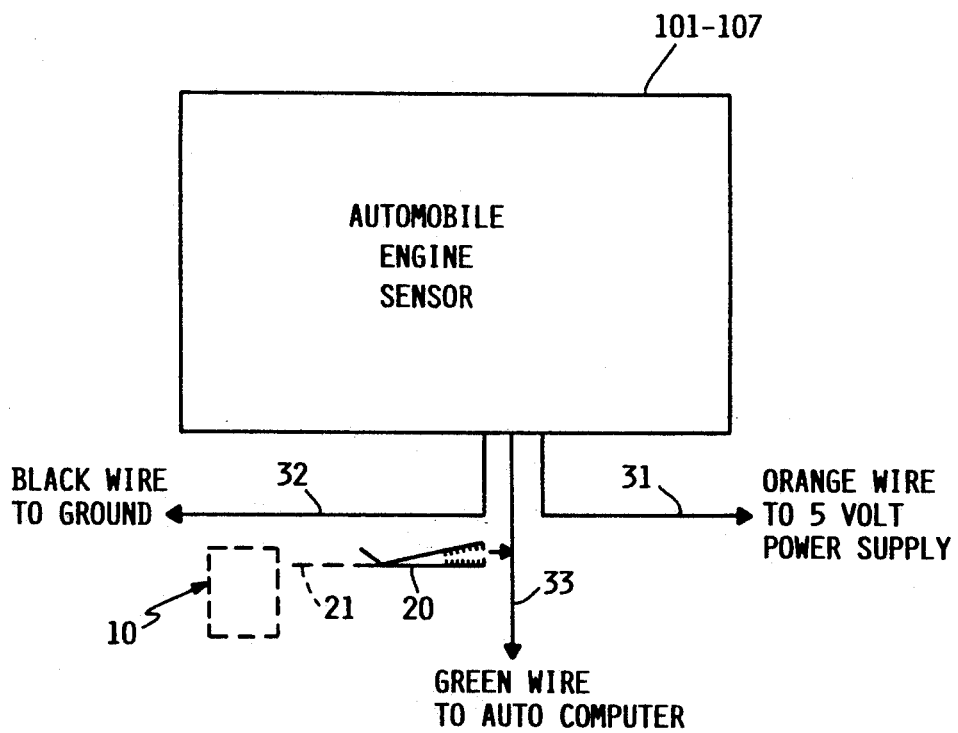
FIG. 3 is a diagrammatic view of an automobile engine sensor, and shows the connection of the auto diagnostic apparatus of FIG. 1 in relation to the automobile engine sensor.

As shown in FIG. 3, each of the automobile engine sensors 101-107 typically includes three electrical leads, an orange wire 31 connected to a 5 volt power supply, a black wire 32 connected to ground, and a green, variable output wire 33 connected to the automobile computer and conveying variable output voltages thereto. The jawed, needle-toothed clip 20 is clipped to the variable output wire 33 at a location adjacent to the sensors 101-107 such that the clip 20 is connected as directly as possible to the sensors 101-107. Such a direct connection minimizes problems that may exist in the connection between the sensors 101-107 and the automobile computer or in the computer itself.

Figure 4:
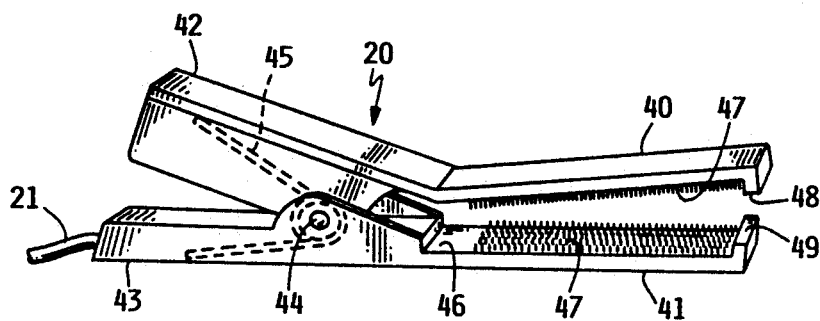
FIG. 4 shows a needle-toothed clip of the auto diagnostic apparatus of FIG. 1, for connection to the variable output lead of the automobile engine sensor of FIG. 3.

As shown in FIG. 4, the needle-toothed clip 20 includes a pair of swingable toothed jaws 40, 41 biased toward each other for engaging one of the leads 33. Each of the jaws 40, 41 is integral with respective finger-sized handles 42, 43 pivotally mounted to each other via a pin 44 and biased apart via a torsion spring 45, which also biases the jaws 40, 41 toward each other. The lead 21 is fixed to handle 43 and electrically connected to both of the jaws 40, 41. Each of the jaws 40, 41 includes, on its respective inner face 46, an elongate bed or plurality of relatively short, needle or micro thin teeth 47 for penetrating or piercing the insulation of the variable output sensor lead 33 to make electrical contact with the lead 33 without destroying the insulation or integrity of the lead 33. After the insulation of the wire has been pierced by the micro-thin teeth 47, the insulation swells or resiliently returns to a form close to its original nonpierced form such that the integrity of the wire is retained. When the jaws 40, 41 are closed, jaw stops 48, 49 engage each other to prevent the teeth 47 from overlapping, but permit the teeth 47 of each of the jaws 40, 41 to confront each other while the tips of the teeth 47 of each of the jaws remain slightly spaced apart. It should be noted that while, if desired, the teeth 47 of each of the jaws 40, 41 may overlap or mesh, such an overlap may increase the chances for damaging the insulation of the leads 33. The beds of teeth 47 are elongate to permit an electrical connection to be made almost anywhere between the jaws 40, 41 such that a precise alignment of the wire between the jaws 40, 41 is not required.

It should be noted that male/female ribbon connectors may replace the banana clips 19 and banana jacks 18, with a plurality of wires 21 extending from one such ribbon connector. It should further be noted that the clips 20 may have coded boots on jaws 42, 43 to match the clips 20 to their respective sensors or connectors 100-109.

As shown in FIG. 5A, a microprocessor 60 controls the routing of the variable output voltages received from the engine sensors or connections 100-109 via the A/D converter 23. The memory module 70 includes information for the conversion of the digital output voltages of a particular sensor, such as the engine coolant temperature (ECT) sensor, to an understandable output value, such as a degree on the Fahrenheit temperature scale. The information contained in the multiplication or look-up table of the module 70 is typically applicable to only one car manufacturer, such as Ford, or to certain Ford vehicles. The memory module 70 typically takes the form of a data card with a magnetic strip and hence is removable from the housing 11 and readily disconnectable from the microprocessor 60 for replacement by another memory module 70 containing conversion information for the sensors utilized by other car manufacturers, such as European or Asian car manufacturers. Accordingly, the needle-toothed clips 20 send output voltages to the A/D converter, which in turn transmits the digital voltages to the microprocessor 60, which in turn multiplies the digital output voltages according to the information in the memory module 70. Such output values are then stored in storage cell 71 and updated by cell 72.

The storage cells 71, 72 in the microprocessor 60 record the minimum and maximum output values corresponding to the output voltages sensed by the sensors or connections 100-109 and updates such minimum and maximum output values when respective lesser or greater output voltages are sensed. Thus intermittent or periodically interrupted signals from the sensors or connections 100-109 are recorded. Such intermittent signals may be caused by a loose sensor wire or be indicative of another problem that may not be diagnosed by recording only the current average voltage which may be a "normal" voltage. The storage cells 71, 72 continuously update the minimum and maximum output values corresponding to the output voltages, then sends the updated output values to the display module 80.

Figure 5B:
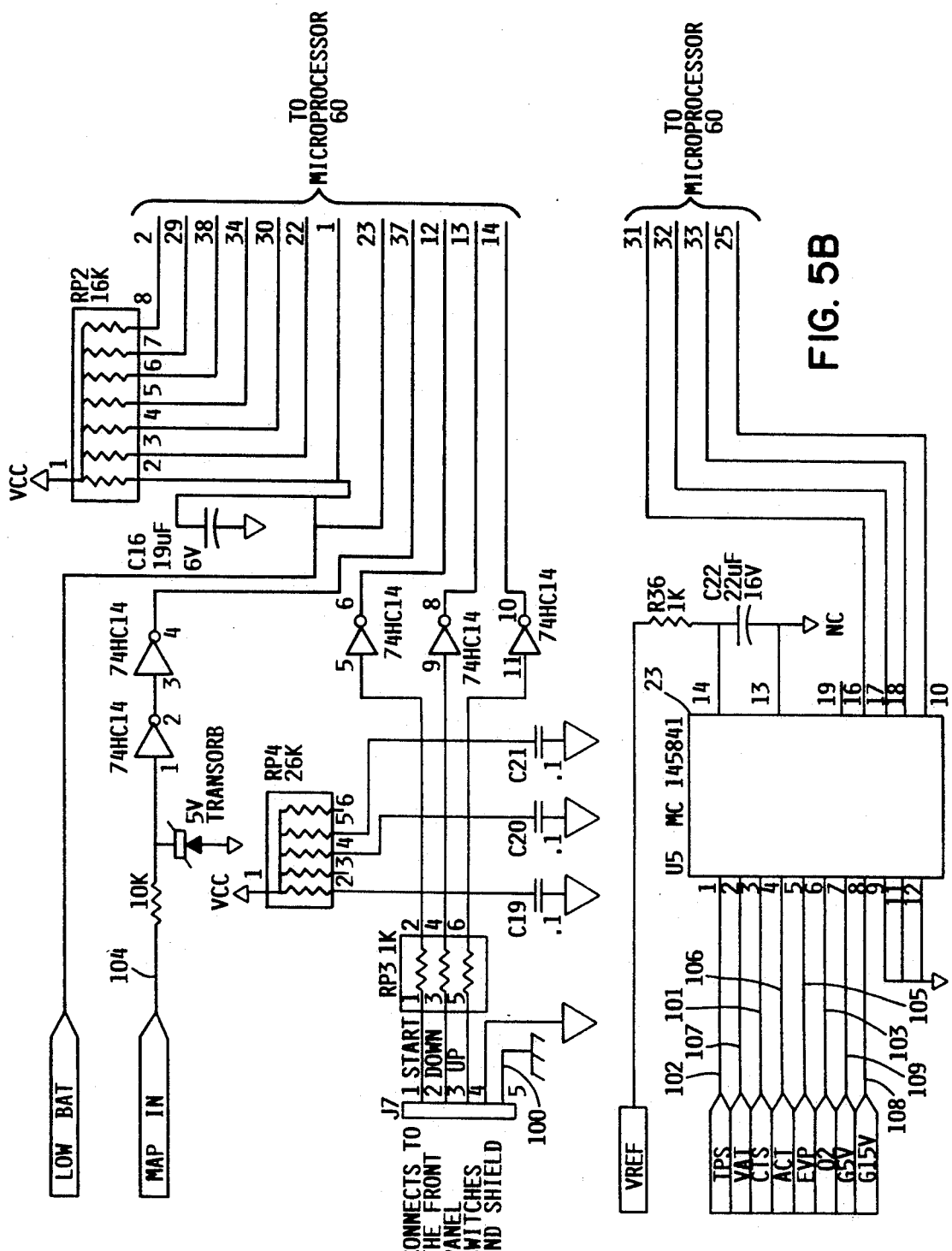
FIGS. 5B and 5C are schematic diagrams of portions of FIG. 5A.
Figure 5C:
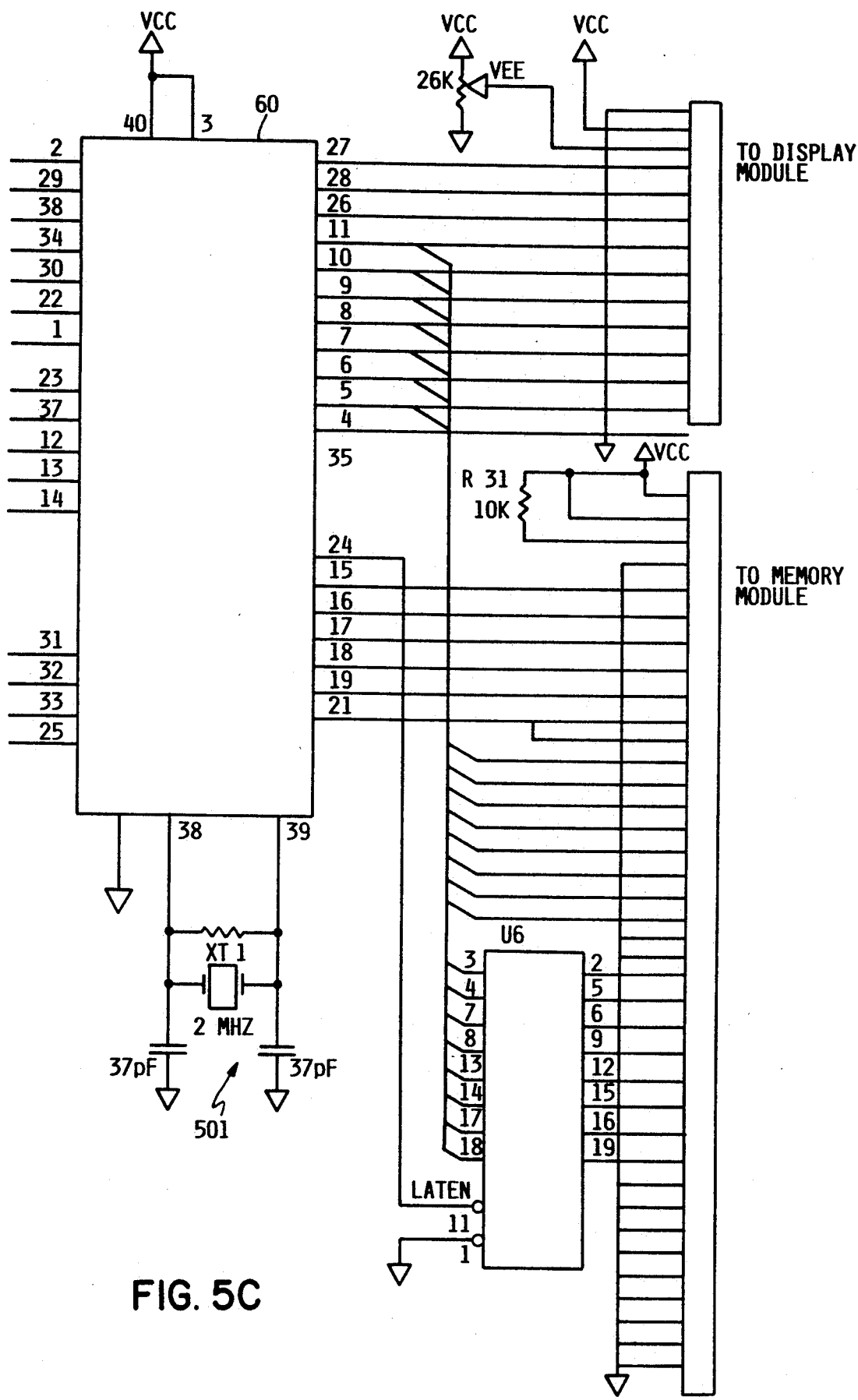

FIG. 5B shows a schematic diagram representation of portions of the functional block diagram shown in FIG. 5A. Microprocessor 60 is preferably a microchip microprocessor manufactured by Motorola under type designation MC688C705C5, or equivalent. It is an 8-bit microprocessor of a type which is well known to those skilled in the art. Microprocessor 60 is connected to means for measuring output voltages 23, otherwise known as an analog to digital (A/D) converter 23. A/D converter 23 is a semiconductor converter preferably made by Microchip Technology Inc., under type designation MC145041, or equivalent. Microprocessor 60 is also connected to display module 80 via a plurality of lines which identify the numeric information to be displayed, and the relative position of the displayed information. Microprocessor 60 is also connected to memory module 70, via a plurality of address and data lines, to permit the selective transfer of data to and from memory module 70, under the direction and control of microprocessor 60. Microprocessor 60 is connected to a two megahertz (Mhz) clock circuit 501, which utilizes a crystal oscillator to provide a uniform time base for controlling all of the sequential operations described herein. Among its other functions, microprocessor 60 develops a sequential series of sampling signals which are utilized in conjunction with A/D converter 23 to obtain periodic samples of the voltages sensed by the various sensors described herein. The circuit parameters are selected so as to permit A/D converter 23 to sample its input lines approximately 20 times per second, which enables microprocessor 60 to obtain a continually updated series of voltage readings from the sensors. It is preferred that the circuit parameters be selected so as to permit A/D converter 23 to sample its input lines at least 18 times per second. A slower sampling or updating may miss intermittent voltages.

In operation, microprocessor 60 sends a clock signal (SCLK) to A/D converter 23, to set the rate of data transfer between the two devices. A/D converter 23 sequentially samples each of the input lines to which it is connected; and therefore samples each of the sensors about 20 times per second. The analog voltage developed on any given input line is converted to a digital value by A/D converter 23, and is thereafter transmitted to microprocessor 60 via a data output line (DOUT). The digital value of the received signal is converted into a suitable value for display 15, and this converted value is stored in the memory module. At the same time, microprocessor 60 develops the requisite signals to the display module to provide the correct digital display for operator use.

The remaining circuits shown in FIG. 5B are conventional circuits, known to those skilled in the art, associated with the connection of switches and other inputs into microprocessor 60. The alphanumeric representations illustrated on FIG. 5B are the conventional representations utilized by the manufacturer in its data sheets associated with the respective semiconductor components. It should be noted that a conventional high impedance circuit, known to those skilled in the art, is connected between the A/D converter 23 and the clips 20.

Figure 6:
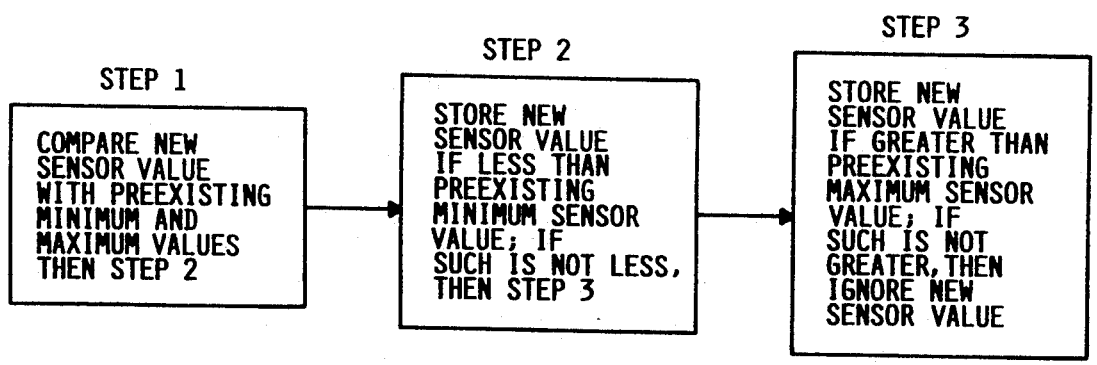
FIG. 6 is a logic flow diagram of the storage means for storing minimum and maximum voltages.

As shown in FIG. 6, the microprocessor 60 may process input sensor values corresponding to the output voltages pursuant to three steps. First, the update means 71 compares the new sensor value with preexisting minimum and maximum values. Second, the storage means 72 stores the new sensor value as the new preexisting minimum sensor value if the new sensor value is less than the preexisting minimum sensor value. If such a new sensor value is not less than the preexisting minimum sensor value, then step 3 is implemented. In step 3, the storage means 72 stores the new sensor value as the new preexisting maximum sensor value if the new sensor value is greater than the preexisting maximum sensor value. If the new sensor value is not greater than the preexisting maximum sensor value, then such a value is ignored. Such steps are carried out with respect to each of the sensors or connections 100-109.

It should be noted that the present memory module 70 is manufactured by Microchip Technology, Inc. and identified by P/N 65464E-25/CB. This module or its equivalent is preferred. As illustrated in FIG. 5A and FIG. 1, a display module 80 connected to the microprocessor 60 controls display of the output values in the LCD display panel 15. The display module 80 controls the display of a live output value in one LCD column 81, (FIG. 1), i.e., an output value derived from a live simultaneous output voltage. The display module 80 further controls the display of the minimum and maximum output values in respective LCD columns 82, 83, i.e., corresponding minimum and maximum output voltage retained by the memory module 70. The processor 60 further includes a freeze mode 84 controlled by the start/freeze/reset switch 14. Operation of the freeze mode 84 freezes the output values on display. It should be noted that, during operation of the freeze mode 84, the storage cells 71, 72 continue to retain the minimum and maximum output voltages and continue to send such information to the display module 80. During operation of the freeze mode 84, a set of four asterisks appears in an LCD "F" column 85 in the display panel 15.

It should be noted that the present LCD display module 80 is the Optrex DMC16433 (16 characters×4 lines). This module or its equivalent is preferred.

The display module 80 provides for the display of information on four sensors in the display panel 15. The display panel 15 displays an abbreviation of each of the four sensors in an LCD column 86, as well as the live, minimum, and maximum output values for each of the four sensors. By operating the respective scroll up and scroll down switches 16, 17, information on other sensors is displayed. The storage cells 71, 72 continuously are updating and storing the minimum and maximum output voltages, whether or not such information is being displayed.

A power supply 90 is preferably a 9 volt battery. Power to the apparatus 10 is controlled by the on/off switch 13. It is preferred that the power supply means 90 is self-contained so that, for example, the housing 11 may be transported from the auto diagnostic area to a customer waiting area. For such transport, the freeze mode 84 is turned on and the banana clips 19 removed from their sockets 18. When the power supply 90 is close to being exhausted, the display panel 15 flashes an asterisk in square 91.

It should be noted that the needle-toothed clips 20 connect to variable output wires running from 10 sensors or "connection locations" on the vehicle being diagnosed. These connection locations include a ground wire (GND) connection 100 for sensing whether the electrical system of the engine is properly grounded. This location is typically adjacent to the main 12 volt battery supply of the vehicle. The output voltage for this connection typically is the same as its output value, i.e., the output voltage of the ground connection is understandable to a technician in voltage units.

An engine coolant temperature (ECT) sensor 101 provides information on engine coolant temperature. This sensor 101 may be located on the engine block of the vehicle. The output voltage of this sensor 101 is converted to an output value reflecting a temperature on the Fahrenheit temperature scale.

A throttle positioning switch (TPS) sensor 102 provides information on the position of the throttle of the carburetor of the vehicle. The output voltage of this sensor 102 is typically the same as the output value as the output voltage is a unit understandable to the auto technician.

An oxygen or gas ($O_2$) sensor 103 provides information on exhaust gases. This sensor 103 is typically located on the exhaust manifold. The output voltage of this sensor 103 is converted to a millivolt output value as the millivolt is a unit more understandable to the auto technician.

A barometric or manifold absolute pressure (MAP) sensor 104 provides information on engine vacuum and vehicle altitudes and is typically located on the inner fender or firewall of the vehicle. The output voltage of this sensor 104 is converted to an output value in hertz, a unit of frequency equal to one cycle per second.

An EGR valve positioning (EVP) sensor 105 provides information on the position of the EGR valve. The output voltage of this sensor 105 is also its output value as the output voltage is a unit understandable to the auto technician.

An air charge temperature (ACT) sensor 106 provides information on the temperature of the incoming air flowing through the air cleaner or intake manifold. The output voltage of this sensor 106 is converted to an output value reflecting a temperature on the Fahrenheit scale.

A vane air temperature (VAT) sensor 107 provides information on the temperature of the incoming air flowing through the air cleaner or intake manifold and is typically located on turbo-charged vehicles only. The output voltage of this sensor 107 is converted to an output value reflecting a temperature on the Fahrenheit temperature scale.

A live main battery (+12 V) connection 108 provides information on the voltages of all 12 volt operated solenoids or relays, etc. This connection may be made anywhere a 12 volt wire is present. The output voltage of this connection 108 is typically the same as its output value as this output voltage is understandable to the auto technician.

The power-to-sensor (+5 V) connection 109 provides information on whether the requisite 5 volts is being supplied to each of the sensors 101-107. This connection 109 is used when it is suspected that the voltage to a certain sensor is intermittent. This connection 109 is made on the orange (+5 V) wire of the sensor at issue. The output voltage of this connection 109 is typically the same as its output value as the output voltage is understandable to the auto technician. It should be noted that connection 109 may serve as a general purpose connection for connection to other sensors such as a mass air flow (MAF) sensor which is located on the incoming air snorkel of the air cleaner. With this sensor, the output value is identified as a voltage as this unit is understandable to the auto technician.

In operation, the auto technician connects the clips 20 to their respective connections or sensors 100-109, most of which are typically found under the hood of the vehicle. The analog voltages are then converted to digital voltages via the A/D converter. The digital voltages are then routed by the microprocessor 60. Specifically, the digital voltages are converted by information in the removable memory module 70 and are thereby converted to output values understandable to an auto technician. These output values are then stored and updated by the microprocessor 60 and routed by the microprocessor to the display module 80. As the engine is running, and perhaps after the engine has run for a predefined period of time, the auto technician reads the values off of the display panel 15. To read all of the sensors, the technician pushes the scroll up/down buttons 16, 17. If his customer is interested in the sensor information, the technician scrolls up or down to desired sensor information, pushes the freeze button 14 to freeze such information on the display panel 15, disconnects the connectors 19 from their sockets 18, and carries the processor 11 to the customer waiting area.

Figure 7:
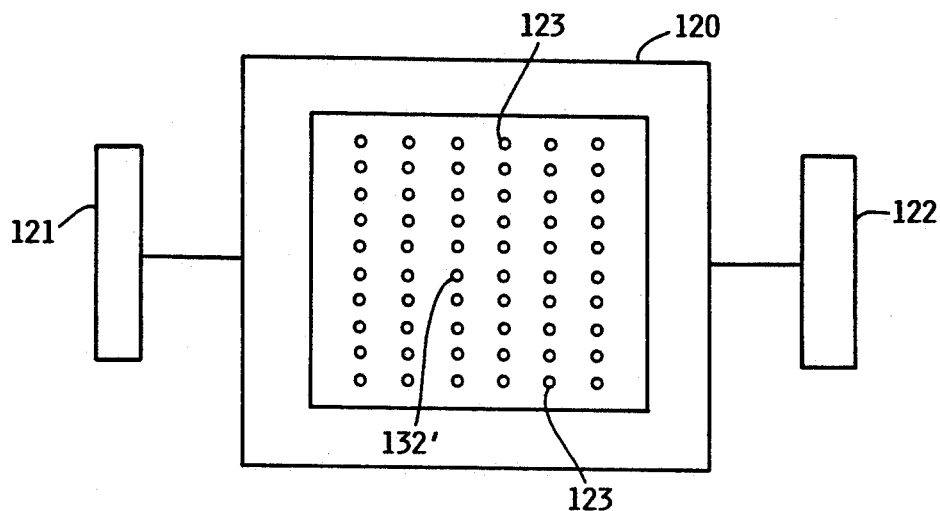
FIG. 7 is a diagrammatic view of a break out box for use in diagnosing Ford vehicles.
Figure 8:
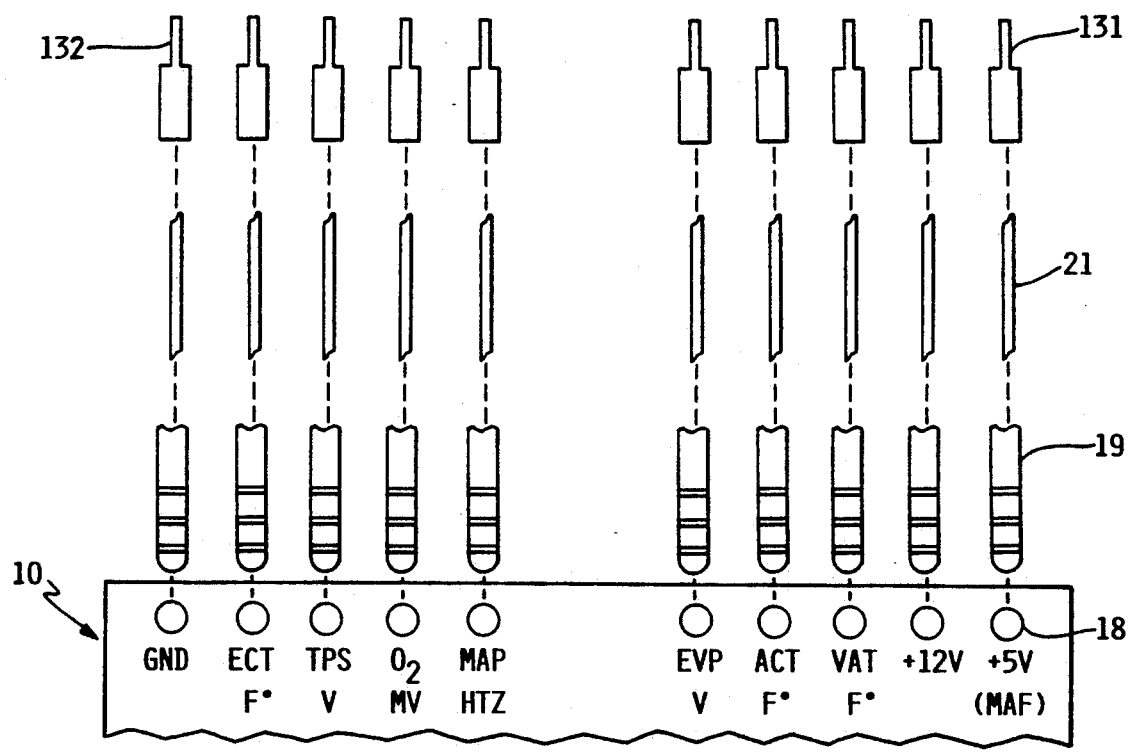
FIG. 8 is a diagrammatic view showing how the auto diagnostic apparatus of FIG. 1 is utilized with the break out box of FIG. 7.

As shown in FIGS. 7 and 8, in an alternate embodiment of the invention, the present diagnostic apparatus 10 may be utilized with a conventional break out box 120 which is typically remote from the sensors such as under the dashboard. The conventional break out box 120 is typically utilized with Ford vehicles and includes ribbon connectors 121, 122 to be connected in series with the electronic engine control system 25 of the car. The break out box 120 includes an array of 60 female sockets 123. An auto technician may diagnose problems with the engine by measuring voltage between any two predefined sockets. Such a process is tedious and time-consuming. However, by replacing the needle-toothed clips 20 with male pin connectors 131 which interconnect with the sockets 123 of the break out box 120, sensor information may be immediately read by the apparatus 10. For example, male pin connector 132 may be code labeled for easy connection to the appropriate female socket, such as female socket 132'. After all of the male pin connectors 131 have been so connected, all of the sensors may be read at one time.

It should be noted that the memory module 70 may include information on vehicles made by other car manufacturers such as GM and Chrysler and foreign car manufacturers such that the apparatus 10 may be utilized for these other vehicles. As far as is known, data stream scanners for GM and Chrysler and other vehicles do not include storage and update means 71, 72 for updating and storing minimum and maximum intermittent output voltages. Furthermore, if desired, instead of connecting the sensor clips 20 directly to the sensors on GM and Chrysler vehicles, an adapter may be devised for connection between the processor 11 and the diagnostic plug of the engine control assembly of the GM and Chrysler vehicles. However, it should be noted that direct connection to the sensors is desired to bypass the engine control assembly.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed:

1. An automobile diagnostic apparatus for obtaining information on an internal combustion engine having engine sensors which monitor multiple operating characteristics of the engine and generate output voltages for the automobile computer, the output voltage from each sensor varying in relation to the operating characteristic at the sensor and being related to the parameter in which the characteristic is measured, and each sensor having an output wire transmitting the output voltage to the automobile computer, comprising:

a) electrical connection means for connecting to the output wires at locations adjacent to the sensors without disconnecting the output wires from the sensors or destroying the integrity of the output wires, the electrical connection means comprising a plurality of leads each transmitting the output voltage from one of the sensors, b) a processor electrically connected to the electrical connection means and receiving the output voltages from each of the sensors and leads and sampling the output voltages a multiplicity of times each second, the output voltages changing as the sensors sense changing operating characteristics of the engine adjacent the sensors, means measuring each of the output voltages and separately converting all of the output voltages from the sensors into digital output values, a memory module containing information relative to each of the operating characteristics of the engine and the parameters in which said characteristics are measured, said memory module receiving all of the digital output values from the sensors and converting the output values into respective display values related to the various parameters in which the operating characteristics are measured, and display means connected with the processor and receiving the display values and displaying the operating characteristics of the engine sensed at each of the sensors, the displayed operating characteristic of each sensor being calibrated in the parameter in which each respective characteristic is measured.

2. The automobile diagnostic apparatus of claim 1, wherein the processor comprises means for storing and updating minimum and maximum digital output values for the operating characteristics at each of the sensors, said memory module receiving ad converting said minimum and maximum digital output values for each of the sensed operating characteristics into minimum and maximum display values, said display means receiving said minimum and maximum display values and displaying the minimum and maximum operating characteristics for each sensor in the parameter in which the respective characteristic is measured.

3. The automobile diagnostic apparatus of claim 1 wherein the processor comprises freeze means for manually inducing a freeze mode in the processor to stop the changing of the digital output values at one point of time, said memory module converting the digital output values established at said one point of time into display values, and the display means displaying the operating characteristics at said one point of time in the parameter of said characteristic.

4. The automobile diagnostic apparatus of claim 1, wherein the memory module includes information on the output voltages of a sensor selected from the group of the following sensors:

a throttle positioning switch sensor, a manifold absolute pressure sensor, an oxygen sensor, an engine coolant temperature sensor, an air charge temperature sensor, an EGR valve positioning sensor, a vane air temperature sensor, a sensor input voltage sensor, a car battery voltage sensor, a ground wire sensor, and a mass air flow sensor.

5. The automobile diagnostic apparatus of claim 1, wherein the memory module includes information on the output voltages of a throttle positioning switch sensor, a manifold absolute pressure sensor, an oxygen sensor, an engine coolant temperature sensor, an air charge temperature sensor, an EGR valve positioning sensor, a vane air temperature sensor, a sensor input voltage sensor, a car battery voltage sensor, a ground wire sensor, and a mass air flow sensor.

6. The automobile diagnostic apparatus of claim 1, and each of the output wires having insulation about a conductive strand, wherein the electrical connection means comprises a clip having a pair of swingable jaws biased toward one another, one of the jaws having a set of relatively short needle teeth for penetrating the insulation to make electrical contact with the conductive strand while maintaining the integrity of the insulation.

7. An internal combustion engine monitoring system including a computer and a diagnostic apparatus for the engine, comprising:

a multiplicity of engine sensors monitoring multiple operating characteristics of the engine and generating output voltages for the automobile computer, the operating characteristics sensed by said sensors being measured in various parameters particularly related to each characteristic sensed and comprising engine coolant temperature, throttle position, oxygen in the exhaust gases and manifold pressure, the output voltage from each sensor varying the relation to the momentary operating characteristic at the sensor and being related to the parameter in which the characteristic is measured, and each sensor having an output wire connecting the sensor to the automobile computer and transmitting output voltage from the sensor to the computer, an electrical connecting means for connecting the output wires at location adjacent to the sensors without disconnecting the output wires from the sensors or destroying the integrity of the output wires, the electrical connection means comprising a plurality of leads each transmitting the output voltages from one of the sensors, a processor electrically connected to the electrical connection means and receiving the output voltages from each of the sensors and leads and sampling the output voltages a multiplicity of times each second, the output voltages changing as the sensors sense changing operating characteristics of the engine adjacent the sensors, means measuring each of the output voltages and converting all of the output voltages from the sensors into digital output values, a memory module containing information relative to each of the operating characteristics of the engine and the parameters in which said characteristics are measured, said memory module receiving all of the digital output values from the sensors and converting the digital output values into display values related to the various parameters in which the operating characteristics are measured, and display means connected with the processor and receiving display values and displaying the operating characteristics of the engine sensed at each of the sensors, and the displayed operating characteristics of each sensor being calibrated in the parameter in which each respective characteristic is measured, and said display means also comprising means for scrolling the display for manually inducing the change of the display of the operating characteristics at said sensors in the parameter in which each respective characteristic is measured.

* * * * *